US008988919B2

(12) United States Patent
Riho

(10) Patent No.: US 8,988,919 B2
(45) Date of Patent: Mar. 24, 2015

(54) SEMICONDUCTOR DEVICE HAVING A CONTROL CHIP STACKED WITH A CONTROLLED CHIP

(71) Applicant: PS4 Luxco S.a.r.l., Luxembourg (LU)

(72) Inventor: Yoshiro Riho, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/274,267

(22) Filed: May 9, 2014

(65) Prior Publication Data

US 2014/0247683 A1 Sep. 4, 2014

Related U.S. Application Data

(63) Continuation of application No. 13/652,030, filed on Oct. 15, 2012, now Pat. No. 8,750,901.

(30) Foreign Application Priority Data

Oct. 18, 2011 (JP) .................................. 2011-228532

(51) Int. Cl.
*G11C 5/06* (2006.01)
*G11C 7/22* (2006.01)
(Continued)

(52) U.S. Cl.
CPC ............ *G11C 11/4063* (2013.01); *H03L 7/097* (2013.01); *G11C 5/063* (2013.01); *G11C 29/023* (2013.01); *G11C 29/028* (2013.01); *G11C 11/4076* (2013.01); *G11C 11/4093* (2013.01); *G11C 11/4096* (2013.01);
(Continued)

(58) Field of Classification Search
CPC ..... G11C 7/1066; G11C 7/222; G11C 29/023; G11C 7/1093; H01L 25/0657
USPC .............. 365/63, 51, 191, 194, 189.07, 233.1
See application file for complete search history.

(56) References Cited

U.S. PATENT DOCUMENTS 6,618,320 B2  9/2003  Hasegawa et al.
7,429,794 B2  9/2008  Ryu et al.
(Continued)

FOREIGN PATENT DOCUMENTS

JP  2002-015567 A  1/2002
JP  2006-013495 A  1/2006
(Continued)

*Primary Examiner* — Ly D Pham
(74) *Attorney, Agent, or Firm* — Foley & Lardner LLP

(57) ABSTRACT

A semiconductor device includes a first controlled chip and a control chip stacked therewith. The first controlled chip includes a first circuit outputting a data signal in response to a synchronization signal, an input/output circuit outputting the data signal to a data terminal in synchronization with a delayed synchronization signal, and a replica circuit replicating an output circuit and outputting a replica signal to a first replica terminal in synchronization with the delayed synchronization signal. The control chip includes a first control circuit outputting a synchronization signal and receiving a data signal, a delay adjustment circuit delaying the synchronization signal and outputting the same as a delayed synchronization signal, a phase comparator circuit comparing the phases of the replica signal and the synchronization signal, and a delay control circuit controlling the delay amount of the delay adjustment circuit based on a comparison result of the phase comparator circuit.

43 Claims, 10 Drawing Sheets

(51) Int. Cl.
    *G11C 7/10*         (2006.01)
    *G11C 7/06*         (2006.01)
    *G11C 11/4063*    (2006.01)
    *H03L 7/097*       (2006.01)
    *G11C 29/02*      (2006.01)
    *G11C 11/4076*    (2006.01)
    *G11C 11/4093*    (2006.01)
    *G11C 11/4096*    (2006.01)
    *H03L 7/081*       (2006.01)
    *G11C 11/40*      (2006.01)
    *H01L 25/065*     (2006.01)

(52) U.S. Cl.
    CPC ............ *H03L 7/0812* (2013.01); *G11C 7/1066* (2013.01); *G11C 7/222* (2013.01); *G11C 11/40* (2013.01); *G11C 7/1093* (2013.01); *H01L 25/0657* (2013.01); *H01L 2224/16145* (2013.01)
    USPC ............... 365/63; 365/51; 365/191; 365/194; 365/189.07; 365/233.1

(56) References Cited

U.S. PATENT DOCUMENTS

| 7,623,398 | B2 | 11/2009 | Arai |
| 2011/0026293 | A1 | 2/2011 | Riho |
| 2011/0084744 | A1 | 4/2011 | Nishioka et al. |
| 2013/0107980 | A1 | 5/2013 | Byeon |

FOREIGN PATENT DOCUMENTS

| JP | 2008-65884 A | 3/2008 |
| JP | 2011-029535 A | 2/2011 |

SEMICONDUCTOR DEVICE HAVING A CONTROL CHIP STACKED WITH A CONTROLLED CHIP

CROSS REFERENCE TO RELATED APPLICATIONS

This application is a continuation of U.S. application Ser. No. 13/652,030, filed Oct. 15, 2012, which claims benefit of priority from the prior Japanese Application No. JP 2011-228532, filed on Oct. 18, 2011; the entire contents of all of which are incorporated herein by reference.

BACKGROUND OF THE INVENTION

This invention relates to a semiconductor device including a plurality of chips, and in particular to a semiconductor device having DLL (Delay Locked Loop) circuits.

Japanese Patent Application Publication No. 2011-029535 (Patent Document 1) discloses a semiconductor device of a COC (Chip On Chip) structure having a plurality of stacked semiconductor chips, in which a DLL circuit is mounted on each of the semiconductor chips (see FIG. 3).

Japanese Patent Application Publication No. 2008-065884 (Patent Document 2) discloses a semiconductor device of a MCM (Multi Chip Module) structure in which a clock signal is transmitted from a DLL circuit of a first chip to a second chip (See FIG. 1). A similar configuration is described also in Japanese Patent Application Publication No. 2006-013495 (Patent Document 3) and Japanese Patent Application Publication No. 2002-015567 (Patent Document 4).

SUMMARY

It is desirable that in a semiconductor device having a plurality of controlled chips stacked on a control chip, all data signals transmitted from the controlled chips to the control chip are synchronized with the same clock signal when received by the control chip. This is because this eliminates the need of processing to synchronize the data received by the control chip with the clock signal and enables high-speed data transmission.

In the configuration described in Patent Document 1, a DLL circuit is mounted on each chip, and synchronization between a data signal and a clock signal is established independently in each chip. Furthermore, this configuration, having a DLL circuit mounted on each chip, consumes a lot of power.

In the configurations described in Patent Documents 2 to 4, a phase-adjusted clock signal is supplied from one chip to another chip, but no consideration is given to synchronize data transmitted from the another chip to the one chip with a clock signal in the one chip.

In one embodiment, there is a provided a device that includes a first controlled chip; and a control chip stacked with the first controlled chip and controlling the first controlled chip. In the device, the first controlled chip includes: a first synchronization signal terminal supplied with a synchronization signal, a first delayed synchronization signal terminal supplied with a delayed synchronization signal, a first data terminal, and a first replica terminal; a first circuit outputting a data signal in response to the synchronization signal; an output circuit outputting the data signal to the first data terminal in synchronization with the delayed synchronization signal; a replica circuit replicating the output circuit and outputting a replica signal to the first replica terminal in synchronization with the delayed synchronization signal; and first to fourth through electrodes passing through the first controlled chip and connected, respectively to the first synchronization signal terminal, the first delayed synchronization signal terminal, the first data terminal and the first replica terminal. The control chip includes: a second synchronization signal terminal, a second delayed synchronization signal terminal, a second data terminal, and a second replica terminal which are connected respectively to the first to fourth through electrodes; a first control circuit generating the synchronization signal, and supplying the generated synchronization signal to at least the second synchronization signal terminal while receiving the data signal via the second data terminal; a delay circuit delaying the synchronization signal and supplying the same to the second delayed synchronization signal terminal as the delayed synchronization signal; a phase comparator circuit comparing the phase of the replica signal supplied via the second replica terminal with a phase of the synchronization signal; and a delay control circuit controlling the delay amount of the delay circuit based on a comparison result of the phase comparator circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

A representative example of a technical concept of the invention to solve the problem will be described below. It should be understood, however, that what is claimed in this application is not limited to the technical concept described herein but is defined only by the appended claims.

Figure 1:
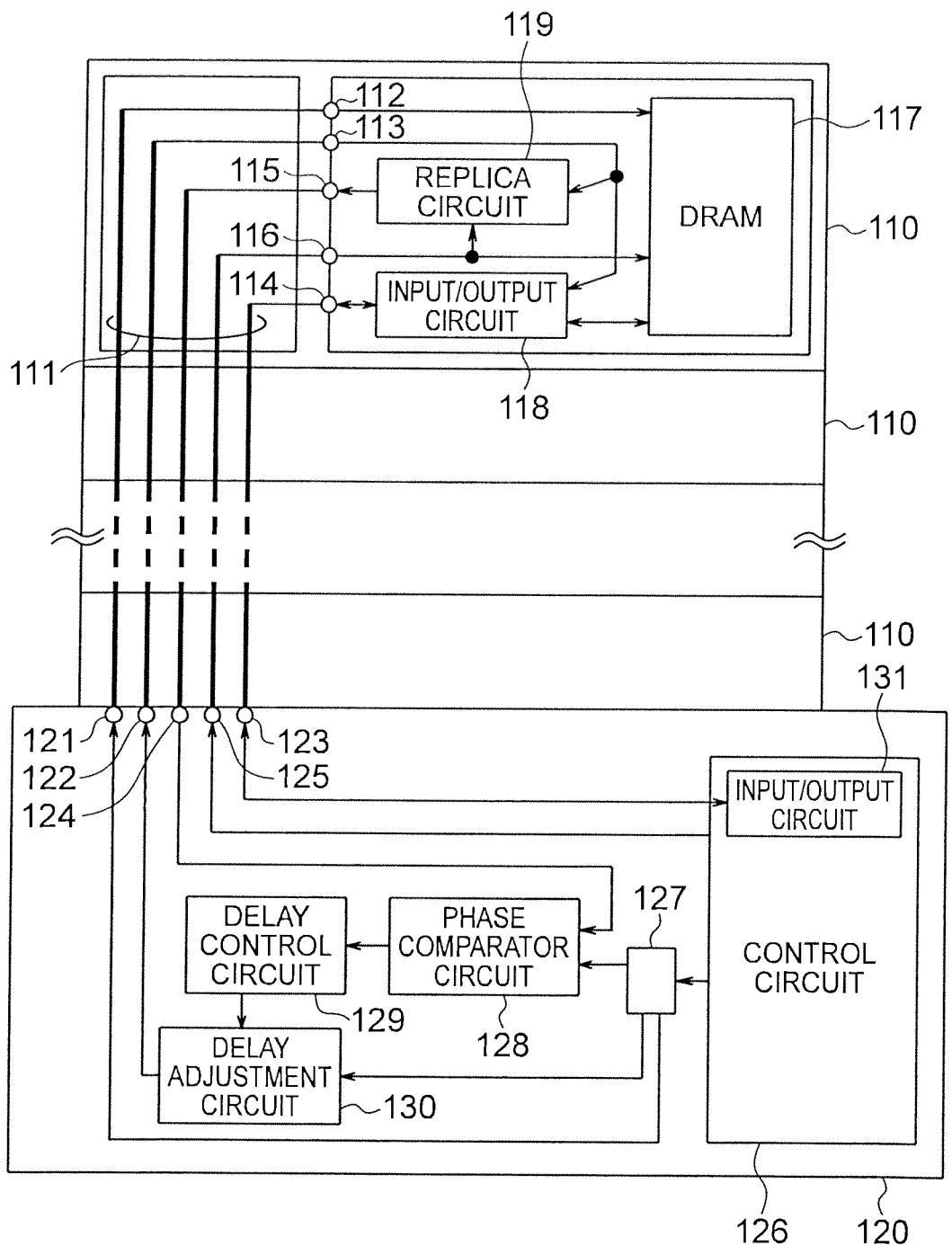
FIG. 1 is a block diagram schematically showing a semiconductor device representing an example of the technical concept of the invention.

FIG. 1 shows a schematic configuration of a semiconductor device 100 according to an example of the technical concept of the invention.

The semiconductor device 100 has a plurality of controlled chips 110 and a control chip 120 for controlling them. The controlled chips 110 are stacked on one another, while they are stacked on the control chip 120.

A circuit related to a DLL circuit included in the semiconductor device 100 is characterized as follows. The control chip 120 has a first control circuit 126 which outputs a synchronization signal and receives a data signal. There are arranged, in this control chip 120, a delay adjustment circuit 130 which delays a synchronization signal and outputs it as a delayed synchronization signal, a phase comparator circuit 128 which compares a phase of a replica signal with a phase of the synchronization signal, and a delay control circuit 129 which controls a delay amount of the delay adjustment circuit based on a comparison result of the phase comparator circuit. The controlled chip 110 has an input/output circuit 118 supplying a data signal. This controlled chip 110 is provided with a replica circuit 119 which replicates an output circuit and outputs a replica signal to a first replica terminal in synchronization with the delayed synchronization signal. Between the control chip 200 and the controlled chips, a plurality of related signals are connected by through electrodes 111.

Each controlled chip 110 has a plurality of through electrodes 111 passing through the same in a thickness direction.

Each controlled chip 110 has a first synchronization signal terminal 112, a first delayed synchronization signal terminal 113, a first data terminal 114, a first replica terminal 115, and a first control signal terminal 116. These terminals are respectively connected to corresponding (first to fifth) through electrodes 111.

Further, each controlled chip 110 has a DRAM array 117, the input/output circuit 118, and the replica circuit 119.

The DRAM array 117 is connected to the first synchronization signal terminal 112 and the first control signal terminal 116, and is also connected to the input/output circuit 118. The input/output circuit 118 is connected to the first delayed synchronization signal terminal 113 and the first data terminal 114. The replica circuit 119 is connected to the first delayed synchronization signal terminal 113, the first replica terminal 115 and the first control signal terminal 116.

On the other hand, the control chip 120 has a second synchronization signal terminal 121, a second delayed synchronization signal terminal 122, a second data terminal 123, a second replica terminal 124, and a second control signal terminal 125. These terminals are respectively connected, via corresponding (first to fifth) through electrodes 111, to the first synchronization signal terminal 112, the first delayed synchronization signal terminal 113, the first data terminal 114, the first replica terminal 115, and the first control signal terminal 116.

The control chip 120 also has a control circuit (first control circuit) 126, a branch unit 127, a phase comparator circuit 128, a delay control circuit 129, and a delay adjustment circuit 130.

The control circuit 126 includes an input/output circuit 131. The input/output circuit 131 is connected to the second data terminal 123. The control circuit 126 is also connected to the second control signal terminal 125.

The branch unit 127 is connected to the control circuit 126 and is also connected to the second synchronization signal terminal 121, the phase comparator circuit 128 and the delay adjustment circuit 130. The phase comparator circuit 128 is connected to the second replica terminal 124. The delay control circuit 129 is connected to the phase comparator circuit 128 and the delay adjustment circuit 130. The delay adjustment circuit 130 is connected to the second delayed synchronization signal terminal 122.

When data is read from or written in the DRAM array 117, the control circuit 126 outputs a control signal (command/address signal) to the second control signal terminal 125, while at the same time outputting a synchronization signal (clock signal CK/CKB) to the branch unit 127. Since this invention is particularly relates to retrieval of data, the following description will be made of a case in which data is read out. Writing of data is performed by the same method as a conventionally known method.

A synchronization signal output from the control circuit 126 is supplied to the second synchronization signal terminal 121 via the branch unit 127. The branch unit 127 generates first and second branched synchronization signals on the basis of the received synchronization signal, and supplies the first branched synchronization signal to the delay adjustment circuit 130 and the second branched synchronization signal to the phase comparator circuit 128.

The delay adjustment circuit 130 delays the received first branched synchronization signal and outputs as a delayed synchronization signal (clock signal CKQ/CKQB) to the second delayed synchronization signal terminal 122. The delayed synchronization signal output to the second delayed synchronization signal terminal 122 is supplied to the input/output circuit 118 and the replica circuit 119 via a corresponding one of the through electrodes 111 and the first delayed synchronization signal terminal 113.

The control signal output by the control circuit 126 is supplied from the second control signal terminal 125 to the DRAM array 117 via a corresponding through electrode 111 and the first control signal terminal 116, and is also supplied to the replica circuit 119. The synchronization signal supplied to the second synchronization signal terminal 121 is also supplied to the DRAM array 117 via a corresponding through electrode 111 and the first synchronization signal terminal 112. As a result of this, data is retrieved from the DRAM array 117 and is supplied to the input/output circuit 118.

The replica circuit 119 is formed by replicating an output circuit included in the input/output circuit 118. The output circuit outputs the data retrieved from the DRAM array 117 as a data signal to the first data terminal 114 in synchronization with a delayed synchronization signal from the first delayed synchronization signal terminal 113. On the other hand, the replica circuit 119 outputs a replica signal to the first replica terminal 115 also in synchronization with the delayed synchronization signal.

The data signal output to the first data terminal 114 is supplied to the input/output circuit 131 via a corresponding through electrode 111 and the second data terminal 123. On the other hand, the replica signal output to the first replica terminal 115 is supplied to the phase comparator circuit 128 via a corresponding through electrode 111 and the second replica terminal 124. The phase of the data signal input to the input/output circuit 131 and the phase of the replica signal input to the phase comparator circuit 128 are preliminarily adjusted to match with each other.

The phase comparator circuit 128 compares a phase of the received replica signal with a phase of the second branched synchronization signal. The phase of the second branched synchronization signal is preliminarily matched with a phase of the synchronization signal supplied to the input/output circuit 131. A comparison result by the phase comparator circuit 128 is transmitted to the delay control circuit 129.

The delay control circuit 129 adjusts the delay amount of the delay adjustment circuit 130 based on the comparison result received from the phase comparator circuit 128 such that the phase of the replica signal input to the phase comparator circuit 128 matches with the phase of the second branched synchronization signal.

When the phase of the replica signal input to the phase comparator circuit 128 matches with the phase of the second branched synchronization signal, the phase of the data signal input to the input/output circuit 131 matches with the phase of the synchronization signal.

In this manner, no matter from which one of the plurality of controlled chips 110 the data signal is transmitted, the phase of the data signal input to the input/output circuit 131 can be matched with a phase of the synchronization signal in the control chip 120. This enables the semiconductor device 100 shown in FIG. 1 to perform high-speed data transmission.

Exemplary preferred embodiments of the invention will be described in detail with reference to the accompanying drawings.

Figure 2:
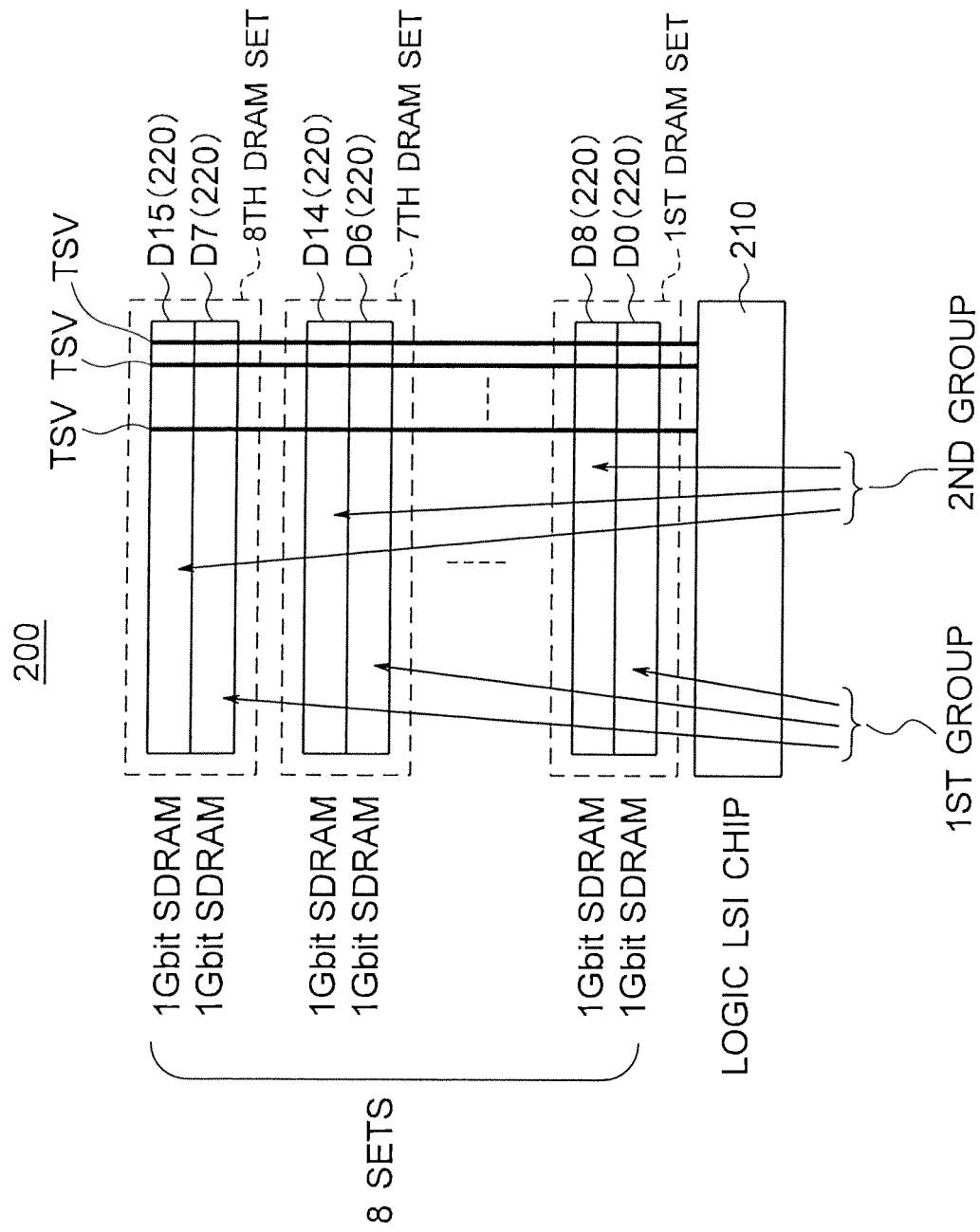
FIG. 2 is a diagram showing a principled configuration of a semiconductor device according to a first embodiment of the invention.

FIG. 2 shows a principled configuration of a semiconductor device according to a first embodiment of the invention.

As shown in FIG. 2, the semiconductor device 200 according to the first embodiment is composed of a logic LSI chip 210 functioning as a control chip and a plurality of SDRAM chips 220 (D0 to D15) stacked on the logic LSI chip 210 and functioning as controlled chips. The control chip is a master chip (active chip), while the controlled chips are slave chips (passive chips). In a semiconductor device composed of a master chip and slave chips, for example, these chips are stacked into an assembly and packaged into a single package to form a structure of system in package. The semiconductor device 200 shown in FIG. 2 is configured by a combination of a so-called COC (chip-on-chip) technique and a TSV (Through-Silicon Via) technique for through electrodes. External terminals (not shown) of the semiconductor device 200 are arranged on the lower side (as viewed in the drawing) of the logic LSI chip 210 via an interposer or the like. The external terminals of the semiconductor device 200 are connected to the logic LSI chip 210. I/O (input/output) signal lines passing through the controlled chips to be described later are connected to the logic LSI chip 210 but not connected directly to the external terminals.

FIG. 2 shows an example in which sixteen SDRAM (Synchronous Dynamic Random Access Memory) chips 220 (D0 to D15) each having a 1 Gbit memory capacity are stacked on the logic LSI (Large Scale Integration) chip 210 functioning as a control chip. Although sixteen SDRAM chips 220 are indicated by D0 to D15 in the example of FIG. 2, the invention is not limited to this.

These sixteen SDRAM chips D0 to D15 are grouped into a first group consisting of SDRAM chips D0 to D7 and a second group consisting of SDRAM chips D8 to D15. The first and second groups are respectively selected by a first clock signal CS0 CK0 and a second clock signal CS1 CK1 issued by the control chip (master chip). In the description below, the first and second groups shall sometimes be referred to simply as "the group" or "the chip select group"

In the shown example, a first DRAM set closest to the logic LSI chip 210 is formed by the SDRAM chips D0 and D8. A second DRAM set is formed by the SDRAM chips D1 and D9, and a third DRAM set and onward are formed likewise. A seventh DRAM set is formed by the SDRAM chips D6 and D14 and an eighth DRAM set is formed by the SDRAM chips D7 and D15. As seen from FIG. 2, the SDRAM chip D15 of the eighth DRAM set is mounted at the furthest position from the logic LSI chip 210. The first to eighth DRAM sets realize a data transfer rate of 51.5 Gbytes/sec by being accessed in parallel by the control chip (master chip). In the description below, the first to eighth DRAM sets shall sometimes be referred to simply as "the set" or "the DRAM set".

The SDRAM chips D0 to D15 have the same through electrode TSV (Through-Silicon Via) structure, that is, PIN structure. More specifically, each of the SDRAM chips D0 to D15 is provided with 382 in total of through electrodes consisting of 256 through electrodes for transferring data signals (DQ), 32 data mask (DM) through electrodes, 64 through electrodes for data strobe signals DQS/DQSB, 14 address through electrodes (A0 to A13), 3 bank address through electrodes (BA0 to BA1), 3 command signal through electrodes (/RAS(RASB), /CAS(CASB), /WE(WEB)), and 10 control signal through electrodes (CS0, CS1, CKE0, CKE1, CK0, CK1, /CK0, /CK1, ODT0, ODT1). It should be understood that in addition to the aforementioned through electrodes, power-supply through electrodes are provided. All of the data signals (DQ), data masks (DM), data strobe signals DQS/DQSB, addresses (A0 to A13), bank addresses (BA0 to BA1), command signals (/RAS(RASB), /CAS(CASB), /WE(WEB)), and control signals (CS0, CS1, CKE0, CKE1, CK0, CK1, /CK0, /CK1, ODT0, ODT1) are signals for managing well-known DRAM functions. The signals CK0, CK1, /CK0, /CK1 are so-called system clocks which are used in communication between the control chip (master chip) and the controlled chips (slave chips) which are synchronous chips.

Figure 3:
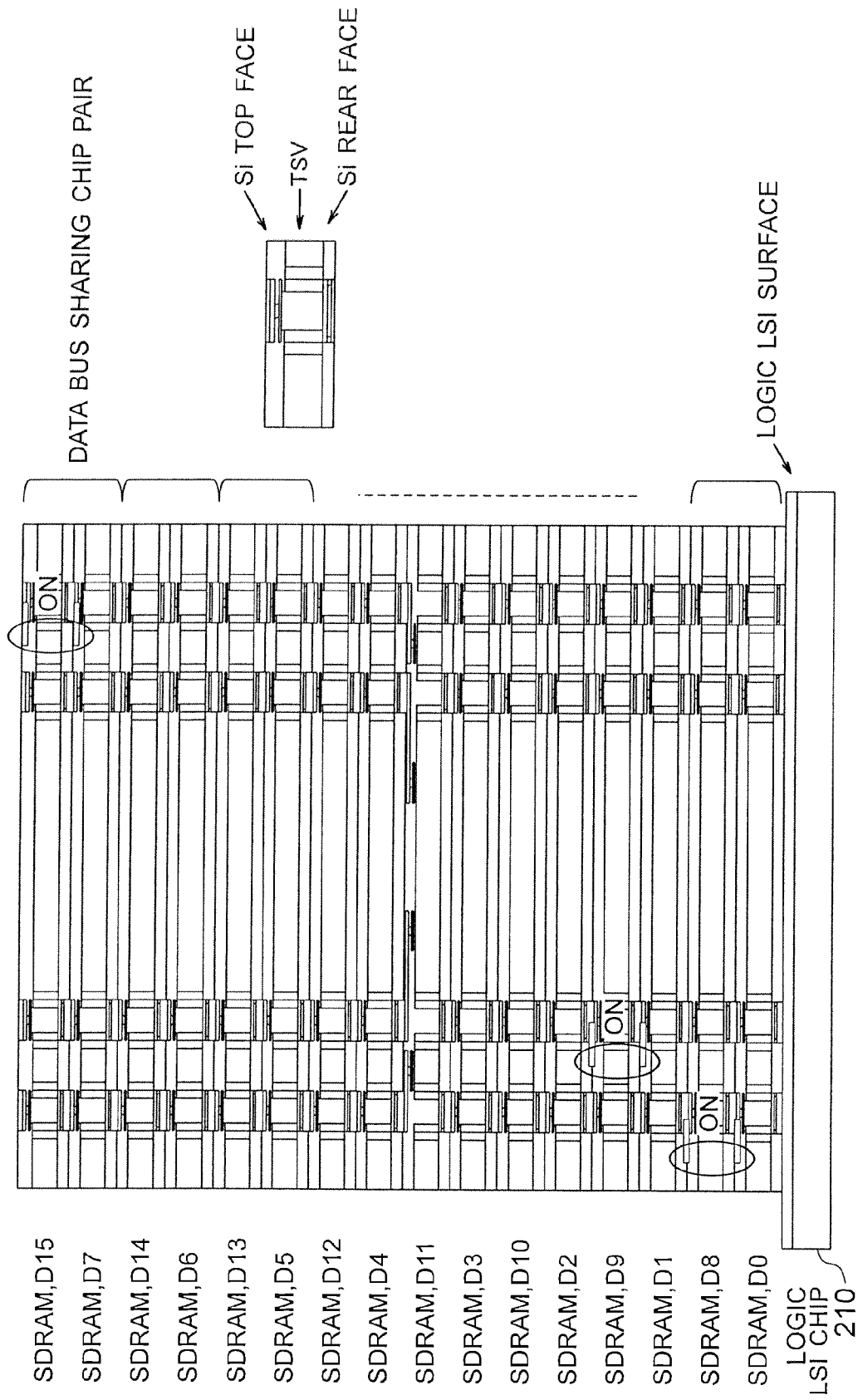
FIG. 3 is a diagram showing a configuration example of a continuous through electrode employed in the semiconductor device shown in FIG. 2.

The through electrodes TSV continuously passing through the SDRAM chips D0 to D15 shall herein be referred to as continuous through electrodes. A configuration example of the continuous through electrodes is shown in FIG. 3.

Returning to FIG. 2, each of the SDRAM chips has an eight-bank configuration and outputs 32-bit data signals in parallel. As mentioned in the above, the 256 through electrodes TSV for transferring data signals (DQ) are shared by two groups (chip select group). In this case, since DDR (Double Data Rate) 3 SDRAM chips usually have a transfer rate of 1600 Mbps, each DRAM chip is able to realize a data transfer rate of 1600 Mbps×32×8 DRAM sets=409.6 Gbit/sec=51.5 Gbytes/sec. The first group (first controlled chips) of the two groups (chip select groups) is communication-controlled at a first access cycle by a first chip select signal output by the control chip. The second group (second controlled chip) of the two groups (chip select groups) is communication-controlled at a second access cycle by a second chip select signal output by the control chip. The control chip controls the first and second groups exclusively to each other to thereby share the through electrodes corresponding to one I/O bit.

As indicated by the solid lines in FIG. 2, the continuous through electrodes TSV are provided to pass through all the SDRAM chips from the SDRAM chip D15 to the SDRAM chip D0. Therefore, the continuous through electrodes TSV constituting the through electrodes for transferring data signals (DQ) and the through electrodes for data strobe signals DQS/DQSB have substantially the same length. Moreover, the continuous through electrodes TSV constituting the address, command, and clock through electrodes also have substantially the same length.

In order to facilitate the understanding of the internal configuration of the semiconductor device according to this embodiment, an internal configuration of a related semiconductor device will be described with reference to FIG. 4.

Figure 4:
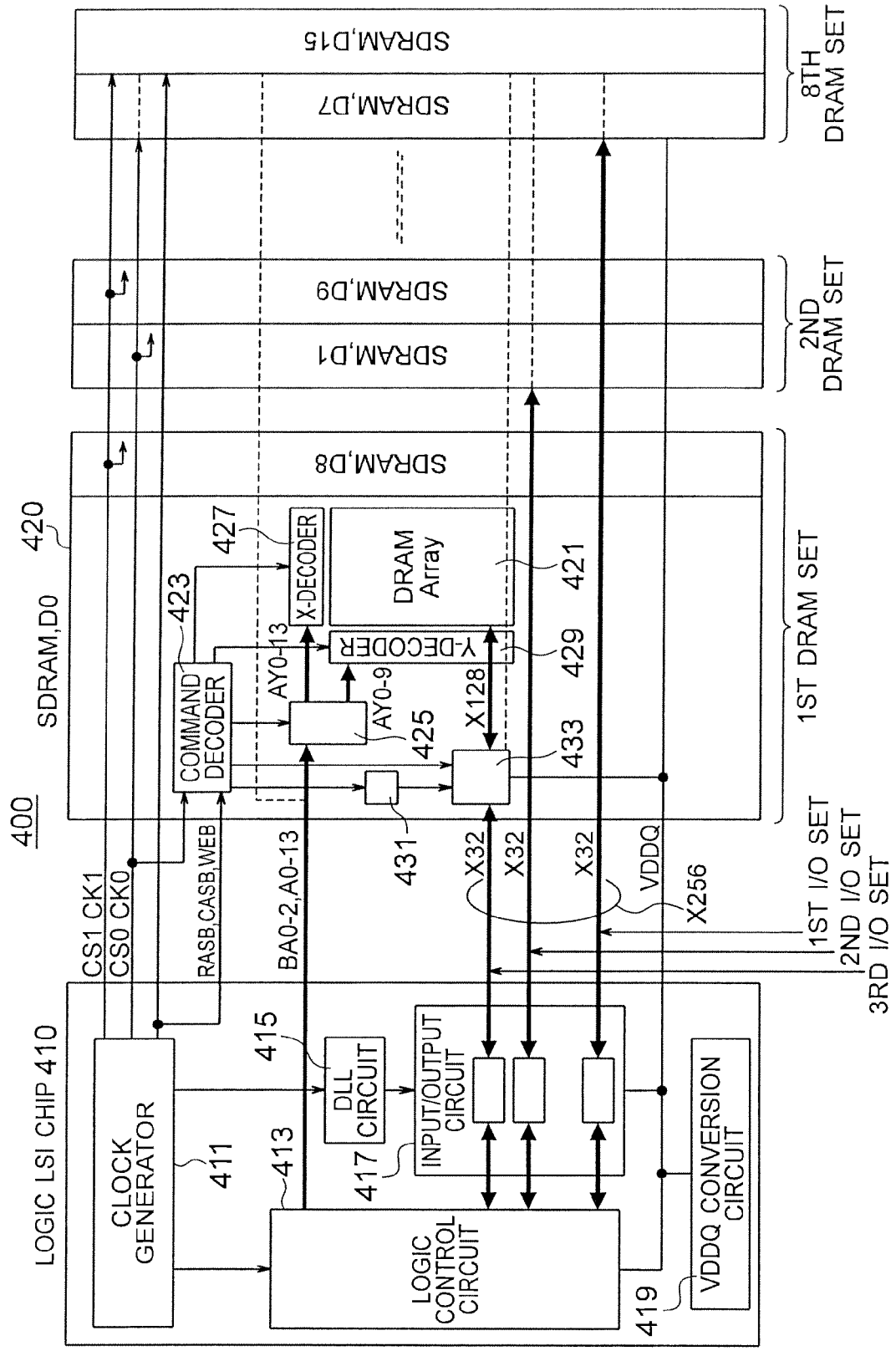
FIG. 4 is a block diagram showing an internal configuration example of a control chip and a controlled chip in a related semiconductor device.

Referring to FIG. 4, an example of internal configuration of a related semiconductor device 400 is shown. In this example as well, like the semiconductor device 200 shown in FIG. 2, it is assumed that eight DRAM sets of SDRAM chips 420 (D0 and D8, D1 and D9 . . . :D7 and D15) are mounted on a logic LSI chip 410. However, the SDRAM chips D0 to D15 are assumed to be 2 Gbit DDR3 SDRAM chips.

The logic LSI chip 410 shown in FIG. 4 has a clock generator 411, a logic control circuit (controller) 413, a DLL circuit 415, an input/output circuit 417, and a VDDQ conversion circuit 419. The VDDQ conversion circuit 419 supplies main power supply VDDQ for driving memory not only to the input/output circuit 417 and the logic control circuit 413 in the logic LSI chip 410 but also to the SDRAM chips D0 to D15 stacked on the logic LSI chip 410.

The clock generator 411 shown here supplies a first clock signal CS0CK0 to the SDRAM chips D0, D1, . . . D7 (belonging to the first controlled chips) constituting the first group (chip select group), while also supplying a second clock signal CS1CK1 to the SDRAM chips D8, D9, . . . D15 (belonging to the second controlled chips) constituting the second group (chip select group). The clock generator 411 further has a function to output command signals RASB, CASB, WEB. A single command is indicated by RASB, CASB, WEB.

The first and second clock signals CS0CK0 and CS1CK1 are supplied to the SDRAM chips D0 to D15 via clock through electrodes TSVs, while a command signal is given to the SDRAM chips D0 to D15 via a command through electrode TSV. Although the first clock signal CS0CK0 need not be supplied to the uppermost SDRAM chip D15 belonging to the second group (chip select group), the through electrode TSV for the first clock signal CS0CK0 is extended to the uppermost SDRAM chip D15 as indicated by the broken line. Thus, the through electrode TSV for the first clock signal CS0CK0 has substantially the same length as the through electrode TSV for the second clock signal CS1CK1. This means that the wiring with the through electrode for the first clock signal CS0CK0 includes a redundant wiring portion that is unnecessary in terms of originally required wiring connection (hereafter, referred to as "the unnecessary redundant wiring").

The logic control circuit 413 provided in the logic LSI chip 410 outputs 3-bit bank address signals BA0 to BA2 and 14-bit address signals A0 to A13, and operates as a controller which exchanges a data signal DQ with the input/output circuit 417. Although this logic control circuit 413 has a similar function to that of a SSTL (Stub Series Terminated Logic) type DDR controller, the logic LSI chip 410 having this controller function in this example is different from a SSTL chip in that it is stacked together with the SDRAM chips D0 to D15. Therefore, the logic LSI chip 410 has electrodes electrically connected with the continuous through electrodes provided in the SDRAM chips D0 to D15.

The shown input/output circuit 417 exchanges a 32-bit-wide data signal DQ with the SDRAM chips D0 to D15, and exchanges the aforementioned 256-bit-wide parallel data signal DQ in total. The data signal DQ is an I/O data signal. When first DRAM set is assigned with a first I/O group (×32 DQ signals), and the second DRAM set is assigned with a second I/O group (×32 DQ signals). The third to eighth DRAM sets are assigned with third to eighth I/O groups, respectively. These eight I/O groups are accessed in parallel by the control chip (master chip), whereby the aforementioned data transfer rate of 51.5 Gbytes/sec is realized. This means that the DRAM set defined by the I/O group determines a data transfer rate, in other words, defines a transfer bandwidth (which indicates the number of I/O transfer bits communicated simultaneously). As the number of DRAM sets increases, the transfer bandwidth becomes wider and the data transfer rate is increased. As the number of I/O bits constituting each I/O group is increased, the transfer bandwidth becomes wider and the data transfer rate is increased. On the other hand, the chip select group determines a memory capacity value. As the number of chip select groups is increased, the memory capacity value becomes greater.

Therefore, it should be noted that, in the semiconductor device configured as shown in FIG. 2 (or FIG. 4), the number of DRAM sets stacked on the logic LSI chip (control chip) 210 (or 410) (master chip) indicates a transfer bandwidth, and the number of chip select groups in each DRAM set indicates a memory capacity. The control chip 210 controls the controlled chips of the first and second sets (first and second DRAM sets) in the same access cycles, whereby information with a predetermined I/O bandwidth (256 data signals (DQ), that is, ×256 I/O) is communicated with the controlled chips.

The bank address signals BA0 to BA2 and 14-bit address signals A0 to A13 are supplied to all of the SDRAM chips D0 to D15 via the address through electrodes.

As is obvious from the above description, all of the first and second clock signal through electrodes TSV, the command signal through electrodes TSV, and the address signal through electrodes TSV have substantially the same length.

The SDRAM chip D0 (first DRAM set) and the input/output circuit 417 of the logic LSI chip 410 are connected to each other through 32 through electrodes TSV for data signal DQ as indicated by ×32 (first I/O group). The input/output circuit 417 is provided with buffers or other interface circuits corresponding to the respective SDRAM chips, and data signals DQ are exchanged between the SDRAM chip D0 and the logic control circuit 413 via these interface circuits. Parallel-serial conversion circuits may be provided in the interface circuits. The through electrode TSV for data signal DQ connecting between the SDRAM chip D0 and the logic LSI chip 410 further extends over the SDRAM chip D0, passing through the SDRAM chips D8, D1, D9, to reach the uppermost SDRAM chip D15, whereby a continuous through electrode is constituted. This means that the through electrode TSV for data signal DQ of the SDRAM chip D0 includes an unnecessary redundant wiring extending from the SDRAM chip D1 (second DRAM set) to the SDRAM chip D15 (eighth DRAM set). As described later, the through electrode TSV for data signal DQ of the SDRAM chip D0 is shared with the SDRAM chip D8 (first DRAM set). This means that the through electrode TSV for data signal DQ of the SDRAM chip D0 is used in common by the first DRAM set (which is composed of the SDRAM chip D0 and the SDRAM chip D8). More particularly, the logic LSI chip 410 and the SDRAM chip D0 are mutually connected by the through electrode TSV for the first data signal DQ, and the SDRAM chip D0 and the SDRAM chip D8 are mutually connected by the second through electrode TSV for data signal DQ that is electrically the same as the first through electrode TSV for data signal DQ. The aforementioned redundant wiring relating to the first DRAM set extends also to the other DRAM sets (second to eighth DRAM sets). However, the through electrodes TSV for data signal DQ used by the first DRAM set (×32) are unnecessary redundant wirings in terms of wiring connection which are originally not used in the second to eighth DRAM sets.

Likewise, the through electrodes TSV for data signal DQ (second I/O group) of the SDRAM chip D1 (second DRAM set) also extend from the input/output circuit 417 of the logic LSI chip 410 to the SDRAM chip D15 through the SDRAM chips D1 and D9. Thus, it can be seen that the through electrodes TSV for data signal DQ of the SDRAM chip D1 also include unnecessary redundant wiring extending to the second to eighth DRAM sets. Likewise, the through electrodes TSV for data signal DQ of the SDRAM chip D7 are provided between the input/output circuit 417 of the logic LSI chip 410 and the SDRAM chip D7. The through electrodes TSV for data signal DQ of the SDRAM chip D7 are also composed of 32 through electrodes and shared with the SDRAM chip D15. In this manner, all the through electrodes TSV for data signal DQ form continuous through electrodes connecting between the logic LSI chip 410 and the uppermost SDRAM chip D15, and have substantially the same length.

Configuration of the SDRAM chips 420 will be described, taking the SDRAM chip D0 as an example. The SDRAM chip D0 shown in FIG. 4 has, in addition to the aforementioned through electrodes, a DRAM array 421 with a memory capacity of 2 GB, a command decoder 423, an address buffer 425, an X decoder 427, a Y decoder 429, a DLL circuit 431, and an input/output circuit 433. Many components included in the SDRAM chip 420 operate in synchronization with the clock CS0CK0, whereas the input/output circuit 433 operates in synchronization with a clock delay-locked by the DLL circuit 431.

The command decoder 423 of the SDRAM chip D0 belonging to the first group (chip select group) decodes command signals RASB, CASB, WEB given by the logic LSI chip 410.

On the other hand, the bank address signals BA0 to BA2 and the address signals A0 to A13from the logic control circuit 413 are given to the address buffer 425. The address buffer 425 outputs address signals AX0 to AX13 and AY0 to AY9 to the X decoder 427 and the Y decoder 429, respectively. Once the address signals AX0 to AX13 and AY0 to AY9 are given to the X decoder 427 and the Y decoder 429 respectively, the shown DRAM array 421 inputs and outputs 128 bit (×128) data signal in parallel to and from the input/output circuit 433. The input/output operation of the 128 bit data signal is performed under control of a command from the command decoder 423 and a clock from the DLL circuit 431.

The input/output circuit 433 exchanges a ×128-bit parallel data signal with the DRAM array 421, while exchanging a 32-bit parallel data signal (×32) with the logic LSI chip 410. This means that the input/output circuit 433 has a function to convert a ×128-bit data signal into a ×32-bit data signal and to convert a ×32-bit data signal into a ×128-bit data signal.

In the configuration shown in FIG. 4, in a plurality of DRAM sets corresponding to a plurality of I/O groups, the through electrodes TSV for data signal DQ and data strobe signal DQS/B of all the DRAM sets can be formed to have substantially the same length. This makes it possible to minimize the skew between the data signal DQ and the data strobe signal DQS/B. In a structure in which a plurality of DRAM sets are stacked sequentially on a controller chip, this configuration (isometric wiring) is of great importance. This is because, in the example described above, it can be formed by ×32 DQ signals per I/O group, and the controller chip is enabled to communication-control the plurality of I/O groups (×256 DQ signals) with only one synchronization signal and yet with high accuracy. Further, the through electrode TSV for address, command, and clock signals can also be formed to have substantially the same length, which makes it possible to minimize the skew between address and clock signals and the skew between the command and clock signals.

As described above, a semiconductor device having a control chip and a plurality of controlled chips which are stacked can be formed by using a so-called TSV technique.

A case will be considered here in which two controlled chips are stacked on a single control chip, and these controlled chips are connected to the control chip via through electrodes.

For example, it is assumed that a first chip is a control chip (master chip), and a second chip (first DRAM set) and a third chip (second DRAM set) are controlled chips (slave chips). When the second and third chips are sequentially stacked on the first chip, communication (read/write) of their I/O groups is performed between the first control chip and the second and third controlled chips. The distance of the signal line (first impedance) connecting between respective circuits of the first control chip and the second controlled chip is different from the distance of the signal line (second impedance) connecting between respective circuits of the first control chip and the third controlled chip, and hence the arrival time of a signal and the amount of reflected waves (based on the respective chips) differ from each other.

In consideration of this, it is pointed out in the description above that the first and second impedances can be made substantially equal to each other by equalizing the distance of the signal line between the first control chip and the second controlled chip with the distance of the signal line between the first control chip and the third controlled chip.

In practice, however, it is preferable to take into consideration that when signal lines are formed by through electrodes, their impedances are not necessarily be equalized due to manufacturing variations possibly occurring during manufacturing processes (TSV fabrication process, bump fabrication process, their connection process). This means that due to variations occurring in the manufacturing processes, through electrodes fabricated in different manufacturing processes may have different impedances.

Further, it is desirable to predict that when a plurality of signal lines are formed by a plurality of through electrodes, these signal lines may have different impedances due to their specific manufacturing variations.

Furthermore, it is desirable to take into consideration that ODTs (On Die Terminations) connecting termination resistors on SDRAM chips may need be individually adjusted according to the manufacturing variations.

In the related semiconductor device 400, as shown in FIG. 4, each chip has its own DLL circuits 415, 431. The distances between the logic LSI chip 410 and the SDRAM chips 420 are different from each other, and hence the phases of clocks supplied from the logic LSI chip 410 to the SDRAM chips 420 differ among the SDRAM chips 420. The SDRAM chips 420 output data from their input/output circuits 433 with use of the DLL circuits 431 at different timings in synchronization with such clocks. The data output from the respective SDRAM chips 420 arrive at the logic LSI chip 410 with different delay times according to different distances to the logic LSI chip 410.

Thus, the data transmitted by the SDRAM chips 420 arrive at the logic LSI chip 410 at different timings. Therefore, the logic LSI chip 410 is required to synchronize these received data with its own clock in order to process the data. It takes time to process the data, which limits the data transmission rate and working speed of the semiconductor device as a whole.

According to this embodiment, therefore, a configuration is made such that data transmitted by all the controlled chips can be received by the control chip at a timing in synchronization with a clock. For this purpose, in this embodiment, a phase comparator circuit constituting a DLL circuit is not provided in the controlled chips but provided in the control chip.

Figure 5:
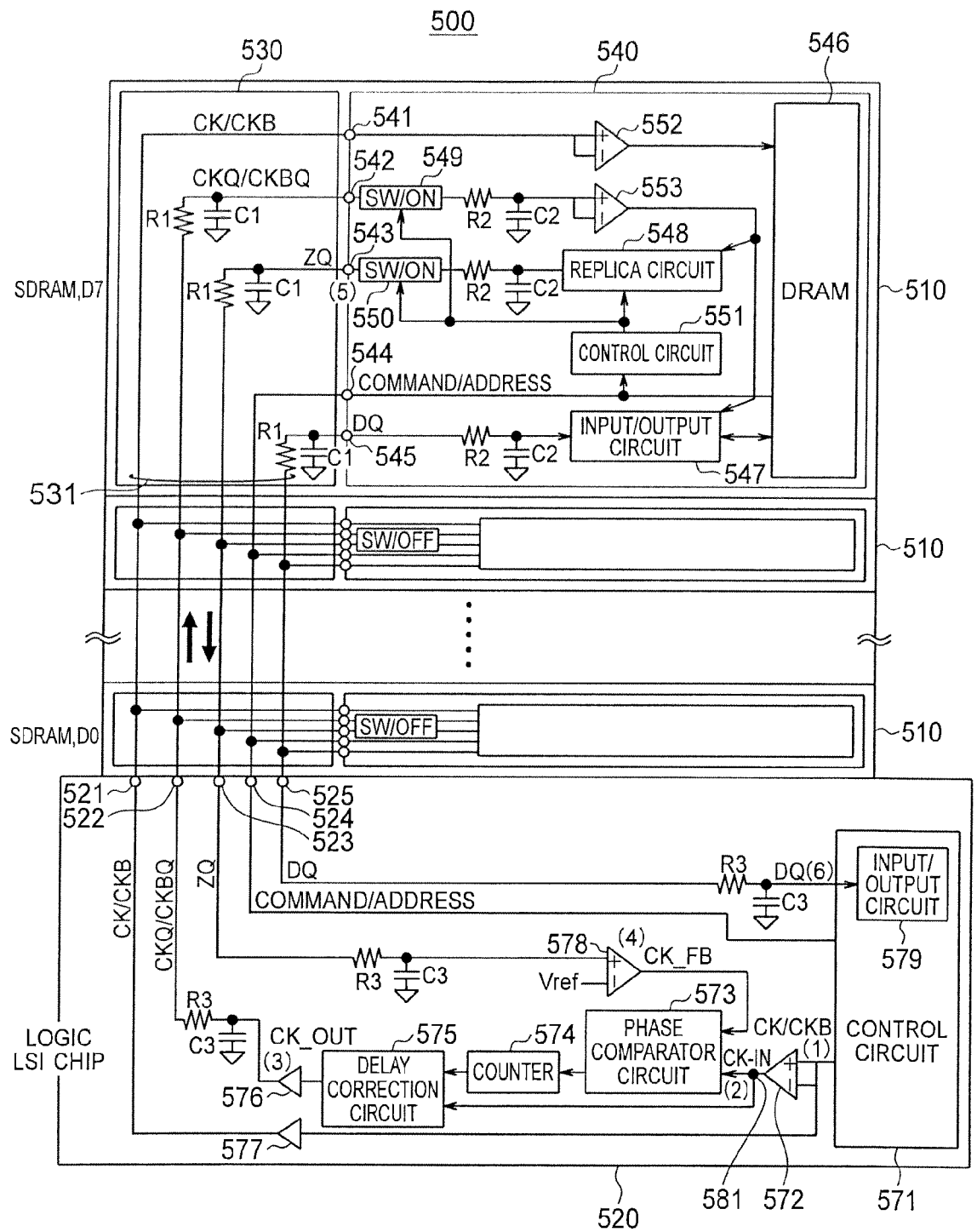
FIG. 5 is a diagram showing a configuration of a principal part of the semiconductor device according to the first embodiment of the invention.

FIG. 5 is a diagram showing a configuration of a principal part of a semiconductor device according to the embodiment.

The shown semiconductor device 500 has a plurality of (eight chips D0 to D7 in this example) SDRAM chips 510 as core chips (controlled chips), and a logic LSI chip 520 on which these SDRAM chips 510 are stacked and which is a control chip for controlling these SDRAM chips 510. One of these SDRAM chips 510 is a first controlled chip and the remaining ones are second controlled chips. However, the first controlled chip and the second controlled chips have the same configuration. The first controlled chip may be stacked on the second controlled chips, or the second controlled chips may be stacked on the first controlled chip.

Each of the SDRAM chips 510 has a through electrode circuit 530 and a DRAM-chip-side circuit 540.

The through electrode circuit 530 is provided with a plurality of through electrodes (TSV) 531. These through electrodes 531 are respectively connected to corresponding through electrodes of the chips which are adjacent in a stacking direction.

FIG. 5 shows five through electrodes (first to fifth through electrodes) 531 relating to the invention. These through electrodes 531 do not necessarily correspond to one signal, but may correspond to a pair of differential signals (complementary signals) (CK/CKB, CKQ/CKBQ), or a set of signals (command/address) including a plurality of signals. Although only one through electrode 531 corresponding to the data signal is shown, the through electrode 531 is present in plurality as described above (for example, 256 through electrodes (see FIG. 4)).

At least three (CKQ/CKBQ, ZQ, DQ) of the shown five through electrodes 531 is each provided with a delay adjustment unit (consisting of a resistance R1 and a capacity C1), so that they are adjusted (trimmed) to equalize the time constants (delay amounts) in the paths.

The DRAM-chip-side circuit 540 has a first synchronization signal terminal 541, a first delayed synchronization signal terminal 542, a first replica terminal 543, a first command/address terminal (control signal terminal) 544, and a first data (DQ) terminal 545. In this embodiment, the first replica terminal 543 is provided by a ZQ terminal that is used for impedance adjustment (ZQ calibration) of the output circuit included in the input/output circuit 547. The use of the ZQ terminal makes it possible to reduce the number of terminals and through electrodes. However, it is also possible to provide a dedicated first replica terminal.

The DRAM-chip-side circuit 540 includes a DRAM array (first circuit) 546, an input/output circuit 547 for outputting data retrieved from the DRAM array 546 to the first data terminal 545 and supplying data input to the first data terminal 545 to the DRAM array 546, a replica circuit 548 replicating an output circuit included in the input/output circuit 547, and switching circuits 549 and 550 respectively connected to a first delayed synchronization signal terminal 542 and the first replica terminal 543, a (second) control circuit 551 for controlling the switching circuits 549, 550 and the replica circuit 548, and receivers 552, 553.

A clock CK/CKB input to the first synchronization signal terminal 541 as a synchronization signal is supplied to the DRAM array 546 and so on via the receiver 552.

A delay clock CKQ/CKBQ input to the first delayed synchronization signal terminal 542 as a delayed synchronization signal is supplied to the input/output circuit 547 and the replica circuit 548 via the receiver 553.

The input/output circuit 547 outputs the data retrieved from the DRAM array 546 to the first data terminal 545 in synchronization with the delay clock CKQ/CKBQ. The input/output circuit 547 also supplies the data input to the first data terminal 545 to the DRAM array 546.

The replica circuit 548 outputs a replica signal synchronized with the input delay clock CKQ/CKBQ to the first replica terminal 543 via the switching circuit 550.

The control circuit 551 controls ON/OFF of the switching circuits 549 and 550 according to a command (control signal) input to the first command/address terminal 544. When any one of the plurality of SDRAM chips 510 is selected, the control circuit 551 of the selected chip is enabled and controls the switching circuits 549 and 550 to be ON. In the other chips not selected, these switching circuits 549 and 550 are controlled to be OFF. In the non-selected chips, the switching circuits 549 and 550 are controlled to be OFF, whereby the non-selected chips are prevented from applying an internal parasitic capacity to the through electrode 531. FIG. 5 shows a state in which the SDRAM chip D7 is selected.

The selection of a SDRAM chip 510 can be performed by preliminarily assigning the respective SDRAM chips 510 with unique identification information, storing them in a storage unit such as a ROM, and comparing the identification information stored in the storage unit with identification information that is notified by means of a command/address signal.

Among signal paths connected to the terminals, at least those connected to the first delayed synchronization signal terminal 542, the first replica terminal 543 and the first data terminal 545 are each provided a delay adjustment unit (consisting of a resistance R2 and a capacity C2), and they are adjusted (trimmed) such that these signal paths have the same time constant (delay amount). These delay adjustment units are adjusted such that when viewed from the logic LSI chip 520 (a second delayed synchronization signal terminal 522, a second replica terminal 523 and a second data terminal 525), the SDRAM chips have the same time constant.

On the other hand, the logic LSI chip 520 has a second synchronization signal terminal 521, a second delayed synchronization signal terminal 522, a second replica terminal 523, a second command/address terminal (control signal terminal) 524, and a second data terminal 525.

The second synchronization signal terminal 521 is connected to the first synchronization signal terminal 541 via a corresponding through electrode (fifth through electrode) 531. The second delayed synchronization signal terminal 522 is connected to the first delayed synchronization signal terminal 542 via a corresponding through electrode (first through electrode) 531. The second replica terminal 523 is connected to the first replica terminal 543 via a corresponding through electrode (second through electrode) 531. The second command/address terminal 524 is connected to the first command/address terminal 544 via a corresponding through electrode (third through electrode) 531. The second data terminal 525 is connected to the first data terminal 545 via a corresponding through electrode (fourth through electrode) 531.

Among signal paths connected to the terminals in the logic LSI chip 520, at least those connected to the second delayed synchronization signal terminal 522, the second replica terminal 523 and the second data terminal 525 are each provided with a delay adjustment unit (consisting of a resistance R3 and a capacity C3), and are adjusted such that these signal paths have the same time constant (delay amount).

The logic LSI chip 520 also has a (first) control circuit 571, a receiver 572, a phase comparator circuit 573, a counter (delay control circuit) 574, delay correction circuit 575, drivers 576, 577, and a comparator circuit 578.

A clock signal CK/CKB from the control circuit 571 is supplied to the second synchronization signal terminal 521 via the driver 577. The clock signal CK/CKB may be a clock supplied from the outside of the logic LSI chip 520.

The clock signal CK/CKB is converted into a first clock signal CK_IN by the receiver 572. The first clock signal CK_IN is branched into two signals by the branch unit 581, and one of the two is supplied to one of the inputs of the phase comparator circuit 573 while the other is supplied to the delay correction circuit 575.

The phase comparator circuit 573 compares a phase of the first clock signal CK_IN supplied to one of its inputs with a phase of a feedback signal CK_FB supplied to the other input, and outputs a comparison result signal representing a phase difference. The feedback signal CK_FB is obtained by the comparator circuit 578 detecting a replica signal input to the second replica terminal 523.

The counter 574 counts up or down according to the comparison result signal from the phase comparator circuit 573, and outputs a count value to the delay correction circuit 575.

The delay correction circuit 575 delays the other of the two first clock signals by a delay time according to the count value from the counter 574, and outputs an output clock signal CK_OUT thus obtained to the second delayed synchronization signal terminal 522 via the driver 576.

The phase comparator circuit 573, the counter 574, and the delay correction circuit 575 described above constitute the principal part of the DLL circuit. Since specific configurations and operation of these circuits are well known (see, for example, FIG. 2 of Japanese Patent Application Publication No. 2010-062937 and FIG. 2 of Japanese Patent Application Publication No. 2011-061457), detailed description thereof will be omitted.

Operation of the semiconductor device 500 configured in this manner will be described. It is assumed here that inter-chip skew relating to the data bus between the SDRAM chips 510 and the logic LSI chip 520 (the line between the first data terminal 545 and the second data terminal 525) is preliminarily removed by calibration or the like. Therefore, the SDRAM chip 510 from which data is to be retrieved need not necessarily be the same as the SDRAM chip 510 including the replica circuit 548 operating as part of the DLL circuit. For example, a replica circuit 548 operating as part of the DLL circuit may be preliminarily selected.

The DLL circuit operates to remove the skew between a plurality of DQ terminals (first data terminals 545) that the SDRAM chips 510 have. While a SDRAM chip 510 from which data is to be retrieved can be selected arbitrarily, it is assumed here that data is to be retrieved from the SDRAM chip D7. It is also assumed that the replica circuit 548 operating as part of the DLL circuit is provided by the one included in the SDRAM chip D7.

The control circuit 571 of the logic LSI chip 520 outputs to the second command/address terminal 524 a command/address signal (control signal) instructing to retrieve data from the SDRAM chip D7. The command/address signal output to the second command/address terminal 524 is transmitted from the second command/address terminal 524 to the first command/address terminal 544 via a corresponding through electrode 531. The command/address signal input to the first command/address terminal 544 is transferred to the control circuit 551 and the DRAM array 546.

The control circuit 551 controls the switching circuits 549 and 550 to be ON according to the command.

The control circuit 571 of the logic LSI chip 520 generates a clock signal CK/CKB.

The clock signal CK/CKB is branched into two, one of which is output to the second synchronization signal terminal 521 by means of the driver 577. The clock CK/CKB output to the second synchronization signal terminal 521 is transmitted to the first synchronization signal terminal 541 via a corresponding through electrode 531. The clock CK/CKB input to the first synchronization signal terminal 541 is transferred to the DRAM array 546 and other components via the receiver 552.

The other of the two branched clock signals CK/CKB (first clock signal CK_IN) is delayed by the delay correction circuit 575 and output as a delay clock signal CKQ/CKBQ to the second delayed synchronization signal terminal 522 by the driver 576. The delay clock CKQ/CKBQ output to the second delayed synchronization signal terminal 522 is transmitted to the first delayed synchronization signal terminal 542 via a corresponding through electrode 531. The delay clock CKQ/CKBQ input to the first delayed synchronization signal terminal 542 is supplied to the replica circuit 548 and the input/output circuit 547 via the switching circuit 549 and the receiver 553.

The input/output circuit 547 synchronizes the data retrieved from the DRAM array 546 with the delay clock CKQ/CKBQ, and outputs it to the first data terminal 545 as a data signal. On the other hand, the replica circuit 548 outputs a replica signal synchronized with the delay clock CKQ/CKBQ to the first replica terminal 543 via the switching circuit 550. The phase of the data signal output to the first data terminal 545 and the phase of the replica signal output to the first replica terminal 543 match with each other since the time constants (R2, C2) of their signal paths are the same.

The data signal output to the first data terminal 545 is transmitted to the second data terminal 525 via a corresponding through electrode 531. The data signal input to the second data terminal 525 is transferred to the input/output circuit 579. The replica signal output to the first replica terminal 543 is transmitted to the second replica terminal 523 via a corresponding through electrode 531. The replica signal input to the second replica terminal 523 is supplied to the phase comparator circuit 573 as a feedback clock signal CK_FB by the comparator circuit 578.

The phase of the data signal input to the input/output circuit 579 and the phase of the feedback clock signal CK_FB input to the phase comparator circuit 573 match with each other since the signal paths have the same time constants (R1, C1, R3, C3).

The phase comparator circuit 573 compares a phase of the feedback clock signal CK_FB with a phase of the first clock signal CK_IN. In this case, the phase of the first clock signal CK_IN input to the phase comparator circuit 573 matches with a phase of the clock signal supplied to the input/output circuit 579. Therefore, if the phase comparator circuit 573 determines that the phase of the feedback clock signal CK_FB and the phase of the first clock signal CK_IN match with each other, the phases of the data signal DQ and the clock signal input to the input/output circuit 579 match with each other. The phase comparator circuit 573, the counter 574, and the delay correction circuit 575 adjust the delay amount of the delay clock signal CKQ/CKBQ such that the phase of the feedback clock signal CK_FB matches with the phase of the first clock signal CK_IN.

The phases of the data signal output from the input/output circuit 547 and the replica signal output from the replica circuit 548 vary according to the delay amount of the delay clock signal CKQ/CKBQ. This makes it possible to match the phase of the data signal input to the input/output circuit 579 with the phase of the clock signal input to the input/output circuit 579.

In this manner, the phase of the data signal input to the input/output circuit 579 can be matched with a phase of the clock signal input to the input/output circuit 579 on the side of the logic LSI chip 520 no matter which of the SDRAM chips D7 to D0 data is retrieved from. Therefore, the variation in impedance of the data (DQ) bus between the logic LSI chip 520 and each of the SDRAM chips 510 can be preliminarily removed by calibration or the like, whereby a skew can be prevented from occurring due to difference in stacked position (difference in length of data (DQ) bus) among the DRAM chips D7 to D0. This makes it possible to improve the data transmission rate and the working speed of the semiconductor device 500.

In this embodiment, the principal part of the DLL circuit such as the phase comparator circuit 573 is provided in the logic LSI chip 520, which makes it possible to realize more significant reduction of power consumption than when every chip is provided with a DLL circuit. When there are eight SDRAM chips, for example, the power consumed by the DLL circuits can be reduced to substantially one eighth.

Although the description of the embodiment above has been made in terms of a case in which the feedback clock signal CK_FB is obtained by using the replica circuit 548 and the first replica terminal 543 of a SDRAM chip (D7 in this example) from which data is to be retrieved, any one of the SDRAM chips may be selected so that the replica circuit 548 or the like of the selected SDRAM chips 510 is used for retrieving data from all the SDRAM chips 510.

In order to more clarify the features of the semiconductor device 500 according to this embodiment, a related semiconductor device will be described as a comparison example.

Figure 6:
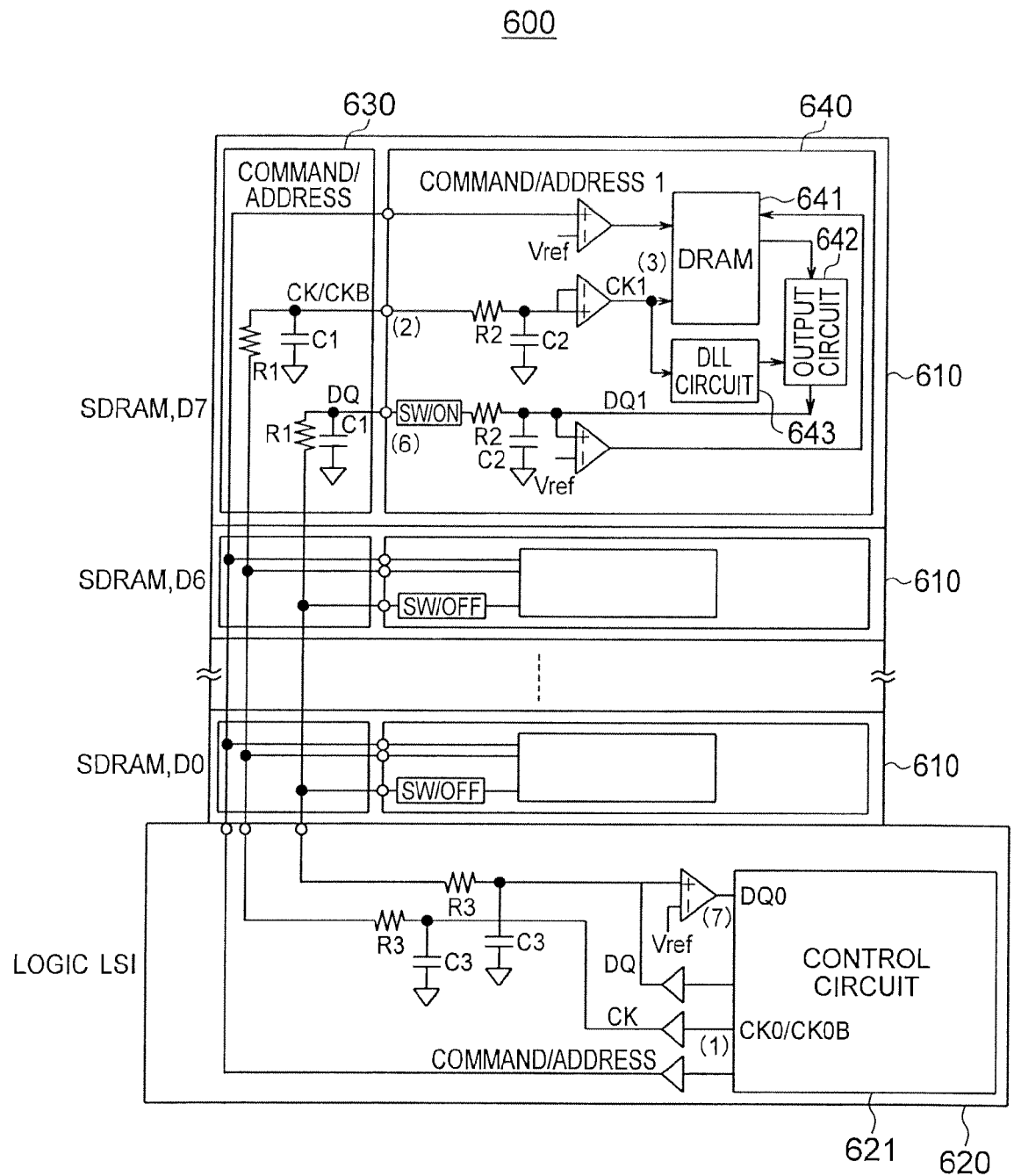
FIG. 6 is a diagram showing a configuration example of a principal part of a related semiconductor device as a comparison example.

FIG. 6 is a diagram showing a configuration of a related semiconductor device 600 as a comparison example. A plurality of (in this example, eight) SDRAM chips (D0 to D7) 610 and a logic LSI chip 620 are stacked and are connected to each other by a plurality of through electrodes formed in through electrode circuits 630.

Each of the SDRAM chips 610 includes a DRAM array 641, an output circuit 642, and a DLL circuit 643 in a DRAM-chip-side circuit 640. The logic LSI chip 620 includes a control circuit 621.

Figure 7:
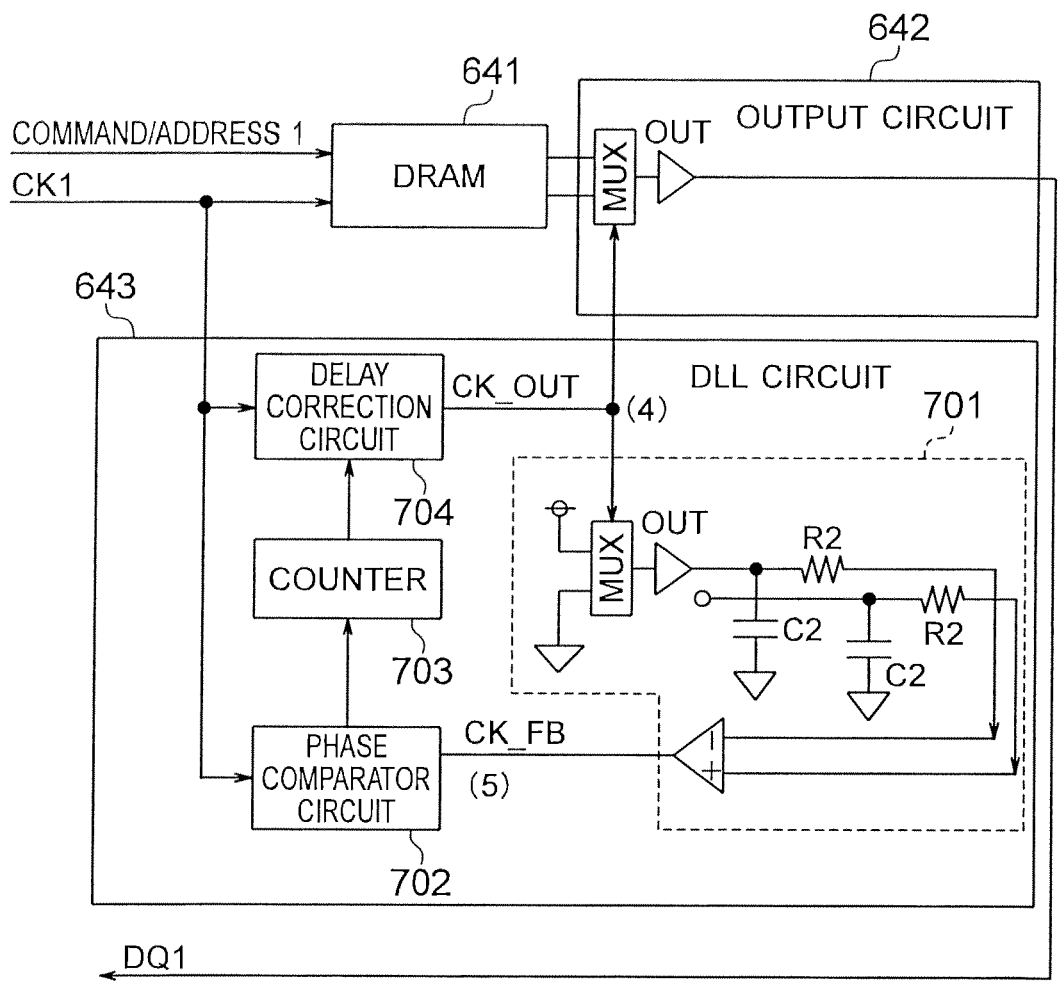
FIG. 7 is a diagram showing an internal configuration example of a DLL circuit included in the semiconductor device shown in FIG. 6.

The DLL circuit 643 is configured, for example, as shown in FIG. 7. Specifically, the DLL circuit 643 has a replica circuit 701 replicating the output circuit 642, a phase comparator circuit 702, a counter (delay control circuit) 703, and a delay correction circuit 704. The phase comparator circuit 702, the counter 703 and the delay correction circuit 704 correspond, respectively, to the phase comparator circuit 573, the counter 574 and the delay correction circuit 575 of FIG. 5. The DLL circuit 643 adjusts the phase of a clock signal CK-OUT so as to match the phase of a clock signal CK1 with a phase of an output of the replica circuit 701.

In the configuration above, the DLL circuit 643 of each of the SDRAM chips 610 operates independently of retrieval of data. This means that the eight DLL circuits 643 operate at the same time. In contrast, the semiconductor device shown in FIG. 5 is configured such that a single DLL circuit operates. Therefore, the semiconductor device according to this embodiment can reduce the power consumed by the DLL circuit to substantially one eighth in comparison with the related semiconductor device.

Operation of the semiconductor device shown in FIG. 6 will be described. When retrieving data from a SDRAM chip 610, the control circuit 621 of the logic LSI chip 620 outputs a command/address signal and a clock signal CK0/CK0B. The clock signal CK0/CK0B is delayed by the through electrode or the like, and reaches the DRAM-chip-side circuit 640 of the SDRAM chip 610 as a clock signal CK/CKB. This clock signal CK/CKB is supplied to the DRAM array 641 as a clock signal CK1, while being also supplied to the DLL circuit 643.

When data is retrieved from the DRAM array 641 in response to a command 1/address 1 signal and the clock signal CK1, the output circuit 642 outputs a data signal DQ1 at a timing corresponding to a clock signal CK_OUT that is timing-adjusted by the DLL circuit 643. The data signal output by the SDRAM chip 610 is delayed by the through electrode or the like, and reaches the control circuit 621 as a data signal DQ0.

Figure 8:
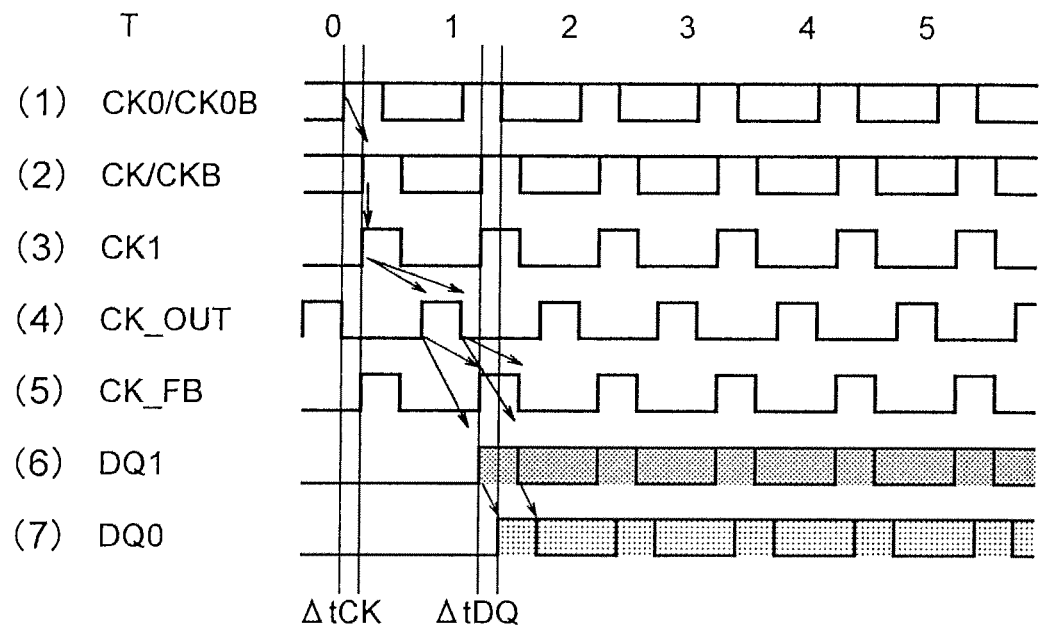
FIG. 8 is a diagram showing various signal waveforms in the semiconductor device shown in FIGS. 6 and 7.

FIG. 8 is a diagram showing signal waveforms of various parts (1) to (7) (see FIGS. 6 and 7) of the related semiconductor device. As seen from FIG. 8, it takes a time $\Delta tCK$ from when the clock signal CK0/CK0B (1) is output by the control circuit 621 until it reaches the DRAM-chip-side circuit 640 as a clock signal CK/CKB (2) and a clock CK1 (3) is input to the DLL circuit 643. It takes a time $\Delta tDQ$ from when a data signal DQ1 (6) is output by the output circuit 642 until it reaches the control circuit 621 as an input data signal DQ0 (7). A sum of the time $\Delta tCK$ and the time $\Delta tDQ$ is observed as a phase difference (timing deviation) between the clock signal CK0/CK0B and the input data signal DQ0 in the control circuit 621.

Figure 9:
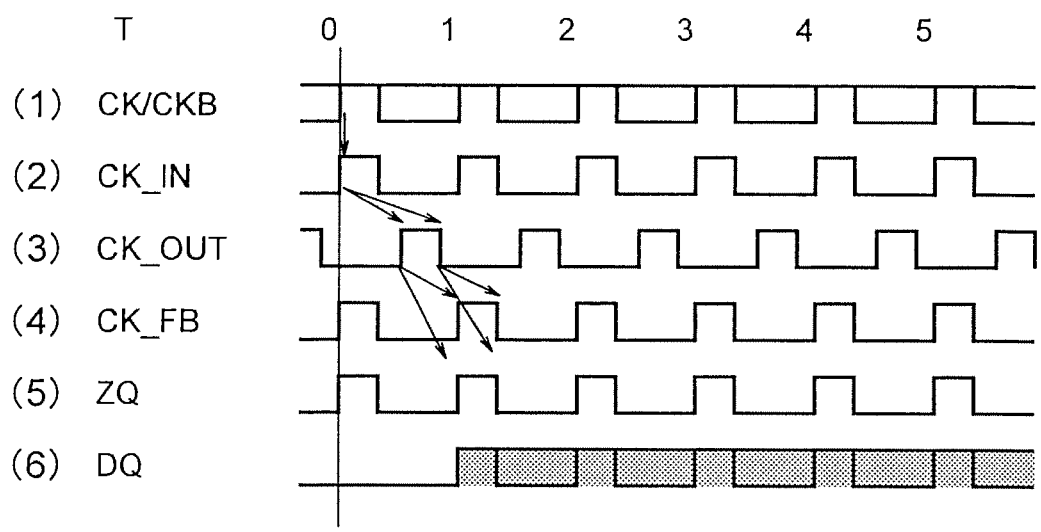
FIG. 9 is a diagram showing various signal waveforms in the semiconductor device shown in FIG. 5.

In contrast, in the semiconductor device according to the embodiment shown in FIG. 5, neither $\Delta tCK$ or $\Delta tDQ$ exists in the signal waveforms of the parts (1) to (6) as shown in FIG. 9, and hence there exists no phase difference (timing deviation) between the clock signal CK0/CK0B and the input data signal DQ in the control circuit 571.

The semiconductor device 500 can be used in various information processing systems.

Figure 10:
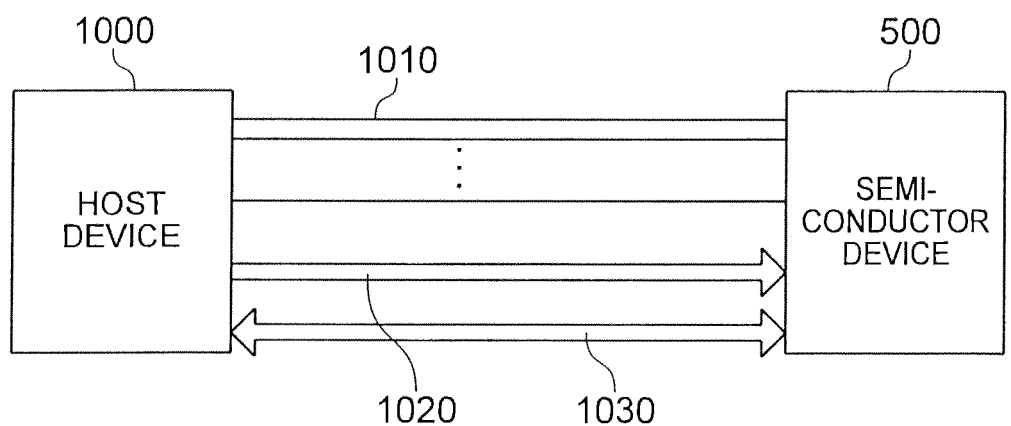
FIG. 10 is a block diagram showing an example of an information processing system formed by using the semiconductor device shown in FIG. 5.

For example, as shown in FIG. 10, the semiconductor device 500 may be connected to a host device 1000 by a command bus 1010, an address bus 1020 and a data bus 1030 to form an information processing system.

Data output from the SDRAM chips 510 of the semiconductor device 500 is consumed by the logic LSI chip 520, or is transferred to the host device 1000, passing through the logic LSI chip 520, or is transferred to the host device 1000 via an intermediate output buffer of the logic LSI chip 520.

Figure 11:
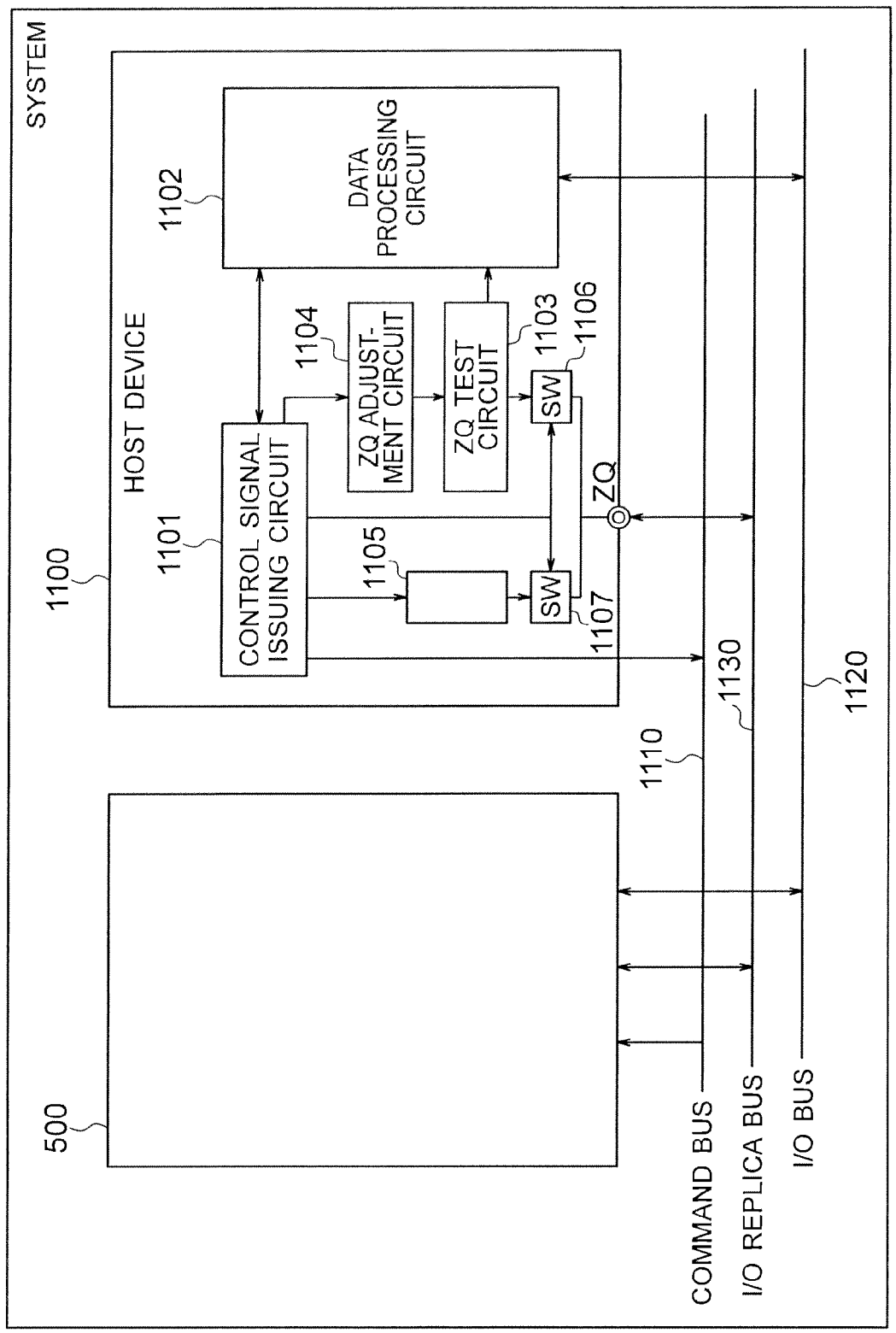
FIG. 11 is a block diagram showing another example of the information processing system formed by using the semiconductor device shown in FIG. 5.

Further, the semiconductor device 500 may be used as a component of an information processing system as shown in FIG. 11.

The system shown in FIG. 11 has the semiconductor device 500 and a host device 1100. The semiconductor device 500 and the host device 1100 are connected to each other by a command bus 1110 and a data input/output (I/O) bus 1120.

The host device 1100 has a control signal issuing circuit 1101 and a data processing circuit 1102.

The host device 1100 controls the semiconductor device 500. The host device 1100 has interfaces with other circuits disposed inside or outside of the system (not shown) to control the system as a whole.

The data processing circuit 1102 of the host device 1100 includes output circuits. The host device 1100 is provided with a ZQ test circuit 1103 and a ZQ adjustment circuit 1104 in order to adjust the impedance (on resistance) of the output circuits in the same manner as in the semiconductor device 500.

Further, the semiconductor device 500 and the host device 1100 are connected to each other by an I/O replica bus 1130, while a circuit corresponding to the replica circuit 548 is provided in the logic LSI chip (120) of the semiconductor device 500, and a circuit 1105 corresponding to the phase comparator circuit 573, the counter 574 and the delay correction circuit 575 is provided in the host device 1100, whereby in the data transmission between the semiconductor device 500 and the host device 1100, the host device 1100 is enabled to synchronize the phase of the data signal transmitted by the semiconductor device 500 with a phase of its own clock.

In the host device 1100, switches SW 1106 and 1107 are connected respectively between the ZQ test circuit 1103 and a ZQ terminal and between the circuit 1105 and the ZQ terminal. The switches SW 1106 and 1107 control the conduction state between the ZQ terminal and the ZQ test circuit 1103 or the circuit 1105 to be ON under control of the control signal issuing circuit 1101.

The system as shown in FIG. 11 can be embodied as various types of electronic equipment including a personal computer, communication electronic equipment, electronic equipment for transportation such as airplanes or automobiles, industrial electronic equipment, and household electronic equipment. The ZQ test circuit 1103 and the ZQ adjustment circuit 1104 may be provided in all the semiconductor devices forming the system, or may be provided some of the semiconductor devices. However, when the ZQ test circuit 1103 and the ZQ adjustment circuit 1104 are provided in all the semiconductor devices, the variations in impedance (on resistance) among the output circuits of the semiconductor devices can be reduced and the accuracy can be improved.

While the invention has been particularly described with reference to its preferred embodiments thereof, the invention is not limited to the embodiments described above, and various modifications and alterations are possible.

The technical concept of this invention is applicable to any semiconductor device which is designed to exchange data between two chips in response to a phase-controlled synchronization signal. Functions of these two chips are applicable to semiconductor devices having various functions. Further, the forms of the various circuits and TSV configurations disclosed in the drawings are not limited to those disclosed in the embodiments above.

The technical concept of the semiconductor device of the invention is applicable to various semiconductor devices. For example, the invention is applicable to semiconductor devices in general, including a CPU (Central Processing Unit), a MCU (Micro Control Unit), a DSP (Digital Signal Processor), an ASIC (Application Specific Integrated Circuit), an ASSP (Application Specific Standard Product), a memory and so on. The semiconductor device to which the invention is applied may assume a product form such as a SOC (System On Chip) or POP (Package On Package). Thus, the invention is applicable to semiconductor devices having such an arbitrary product form or package form.

The transistor can be a field effect transistor (FET), and not only MOS (Metal Oxide Semiconductor) but also MIS (Metal-Insulator Semiconductor), TFT (Thin Film Transistor) and various other FETs can be used. Further, a bipolar transistor may be provided in a part of the device.

Further, NMOS transistors (N-type channel MOS transistors) are representative example of first conductive type transistors, while PMOS transistors (P-type channel MOS transistors) are representative example of second conductive type transistors.

Furthermore, a variety of combinations and selections of various elements disclosed in the foregoing embodiments are possible within the scope of the invention defined in the claims. It should be understood that all the modifications and alterations that will apparent to those skilled in the art based on the disclosures and technical concept including those of the claims fall within the scope of the invention.

What is claimed is:

1. A method for synchronizing a plurality of stacked semiconductor devices interconnected by through electrodes, the method comprising:

providing a clock signal on a first through electrode to each of the plurality of stacked semiconductor devices;

providing a command/address signal on a second through electrode to each of the plurality of stacked semiconductor devices, whereby a selected one of the plurality of stacked semiconductor devices is selected;

providing a delay clock signal on a third through electrode to each of the plurality of stacked semiconductor devices;

receiving a feedback clock signal synchronized with the delay clock signal from the selected one of the plurality of stacked semiconductor devices on a fourth through electrode;

adjusting the delay of the delay clock signal in accordance with a difference between a phase of the feedback clock signal and a phase of the clock signal; and receiving a data signal from the selected one of the plurality of stacked semiconductor devices in synchronization with the adjusted delay clock signal on a fifth through electrode.

2. The method as claimed in claim 1 wherein the clock signal is a pair of differential clock signals.

3. The method as claimed in claim 1 wherein the delay clock signal is a pair of differential delay clock signals.

4. The method as claimed in claim 1 wherein the feedback clock signal is a pair of differential feedback clock signals.

5. The method as claimed in claim 1 wherein the command/address signal is a plurality of command/address signals.

6. The method as claimed in claim 1 wherein the data signal is a plurality of data signals.

7. The method as claimed in claim 1 wherein the plurality of stacked semiconductor devices are memory devices.

8. The method as claimed in claim 7 wherein the plurality of stacked semiconductor devices are DRAM devices.

9. The method as claimed in claim 7 wherein the data signal is a read data signal.

10. The method as claimed in claim 1 wherein the plurality of stacked semiconductor devices are stacked and interconnected by through electrodes with a control chip.

11. The method as claimed in claim 10 wherein the control chip provides the clock signal and the delay clock signal to the plurality of stacked semiconductor devices, and receives the feedback clock signal from the selected one of the plurality of stacked semiconductor devices.

12. The method as claimed in claim 11 wherein the feedback clock signal is delayed through a delay adjustment unit.

13. The method as claimed in claim 12 wherein the delay adjustment unit comprises a resistor and capacitor.

14. The method as claimed in claim 11 wherein the control chip comprises a DLL for adjusting the delay of the delay clock signal to reduce the different between the phase of the feedback clock signal with and the phase of the clock signal.

15. The method as claimed in claim 14 wherein the DLL comprises a phase comparator, a counter, and a delay adjustment circuit.

16. The method as claimed in claim 10 wherein the control chip provides the command/address signal to the plurality of stacked semiconductor devices.

17. The method as claimed in claim 10 wherein the control chip receives the data signal from the selected one of the plurality of stacked semiconductor devices.

18. The method as claimed in claim 17 wherein the data signal is delayed through a delay adjustment unit.

19. The method as claimed in claim 18 wherein the delay adjustment unit comprises a resistor and capacitor.

20. The method as claimed in claim 1 wherein each of the plurality of stacked semiconductor devices are assigned unique identification information which is compared with information in the command/address signal to select the selected one of the plurality of stacked semiconductor devices.

21. The method as claimed in claim 20 wherein the unique identification information is stored in a ROM.

22. The method as claimed in claim 1 wherein each of the plurality of stacked semiconductor devices comprises a switch connecting the third through electrode to an internal circuit that is turned on only in the selected one of the plurality of stacked semiconductor devices.

23. The method as claimed in claim 1 wherein each of the plurality of stacked semiconductor devices comprises a switch connecting the fourth through electrode to an internal circuit that is turned on only in the selected one of the plurality of stacked semiconductor devices.

24. The method as claimed in claim 1 wherein each of the plurality of stacked semiconductor devices comprises an output circuit connected to the fifth through electrode and a replica circuit replicating the output circuit connected to the fourth through electrode.

25. A system comprising:
a first semiconductor device; and
a plurality of stacked semiconductor devices interconnected by through electrodes, wherein the first semiconductor device is configured to:
provide a clock signal on a first through electrode to each of the plurality of stacked semiconductor devices;
provide a command/address signal on a second through electrode to each of the plurality of stacked semiconductor devices, whereby a selected one of the plurality of stacked semiconductor devices is selected;
provide a delay clock signal on a third through electrode to each of the plurality of stacked semiconductor devices;
receive a feedback clock signal synchronized with the delay clock signal from the selected one of the plurality of stacked semiconductor devices on a fourth through electrode;
adjust the delay of the delay clock signal in accordance with a difference between a phase of the feedback clock signal and a phase of the clock signal; and
receive a data signal from the selected one of the plurality of stacked semiconductor devices in synchronization with the adjusted delay clock signal on a fifth through electrode.

26. The system as claimed in claim 25 wherein the clock signal is a pair of differential clock signals.

27. The system as claimed in claim 25 wherein the delay clock signal is a pair of differential delay clock signals.

28. The system as claimed in claim 25 wherein the feedback clock signal is a pair of differential feedback clock signals.

29. The system as claimed in claim 25 wherein the command/address signal is a plurality of command/address signals.

30. The system as claimed in claim 25 wherein the data signal is a plurality of data signals.

31. The system as claimed in claim 25 wherein the plurality of stacked semiconductor devices are memory devices.

32. The system as claimed in claim 31 wherein the plurality of stacked semiconductor devices are DRAM devices.

33. The system as claimed in claim 31 wherein the data signal is a read data signal.

34. The system as claimed in claim 25 wherein the first semiconductor device is a control chip, and wherein the plurality of stacked semiconductor devices are stacked with the control chip and interconnected by through electrodes with the control chip.

35. The system as claimed in claim 34 wherein the control chip comprises a delay adjustment unit for delaying the feedback clock signal.

36. The system as claimed in claim 35 wherein the delay adjustment unit comprises a resistor and capacitor.

37. The system as claimed in claim 34 wherein the control chip comprises a DLL for adjusting the delay of the delay clock signal to reduce the different between the phase of the feedback clock signal with and the phase of the clock signal.

38. The system as claimed in claim 37 wherein the DLL comprises a phase comparator, a counter, and a delay adjustment circuit.

39. The system as claimed in claim 25 wherein each of the plurality of stacked semiconductor devices is assigned unique identification information which is compared with information in the command/address signal to select the selected one of the plurality of stacked semiconductor devices.

40. The system as claimed in claim 39 wherein the unique identification information is stored in a ROM.

41. The system as claimed in claim 25 wherein each of the plurality of stacked semiconductor devices comprises a switch connecting the third through electrode to an internal circuit that is configured to be turned on only in the selected one of the plurality of stacked semiconductor devices.

42. The system as claimed in claim 25 wherein each of the plurality of stacked semiconductor devices comprises a switch connecting the fourth through electrode to an internal circuit that is configured to be turned on only in the selected one of the plurality of stacked semiconductor devices.

43. The system as claimed in claim 25 wherein each of the plurality of stacked semiconductor devices comprises an output circuit connected to the fifth through electrode and a replica circuit replicating the output circuit connected to the fourth through electrode.

* * * * *